(12) United States Patent
Yang et al.

(10) Patent No.: US 6,818,524 B1
(45) Date of Patent: Nov. 16, 2004

(54) METHOD OF IMPROVING ALIGNMENT FOR SEMICONDUCTOR FABRICATION

(75) Inventors: Tung-Liang Yang, Tao-Yuan Hsien (TW); Yi-Nan Chen, Taipei (TW)

(73) Assignee: Nanya Technology Group, Tao-Yuan Hsien (TW)

( * ) Notice: Subject to any disclaimer, the term of this patent is extended or adjusted under 35 U.S.C. 154(b) by 0 days.

(21) Appl. No.: 10/708,871

(22) Filed: Mar. 30, 2004

(51) Int. Cl.[7] .............................................. H01L 21/76
(52) U.S. Cl. ........................ 438/401; 438/238; 438/381
(58) Field of Search ........................ 438/401, 238–256, 438/381–399

(56) References Cited

U.S. PATENT DOCUMENTS 6,197,481 B1 * 3/2001 Chang et al. ............... 430/314

* cited by examiner

Primary Examiner—H. Jey Tsai
(74) Attorney, Agent, or Firm—Winston Hsu

(57) ABSTRACT

A method of improving alignment for the fabrication of bit line contacts (CBs) is disclosed. A substrate including a memory array area and a peripheral area is provided. A plurality of columns of word lines are laid on the substrate within the memory array area, and at least one alignment mark is provided within the peripheral area. A dielectric layer is deposited over the memory array area and peripheral area to cover the plural word lines and the alignment mark. A thin SiN film is deposited over the dielectric layer. A polysilicon hard mask layer is then deposited over the thin SiN film. A GV photoresist is formed on the polysilicon hard mask layer. The GV photoresist is subjected to suitable radiation exposure and then developed to form an opening that exposes a portion of the polysilicon hard mask layer above the alignment mark. The exposed polysilicon hard mask layer is then etched away through the opening, thereby exposing a portion of the thin SiN film within the opening.

6 Claims, 9 Drawing Sheets

METHOD OF IMPROVING ALIGNMENT FOR SEMICONDUCTOR FABRICATION

BACKGROUND OF INVENTION

1. Field of the Invention

The present invention relates generally to semiconductor processes. More particularly, the present invention relates to a semiconductor process that is capable of improving alignment accuracy and preventing $M_0$ metal open problem in the alignment mark region.

2. Description of the Prior Art

A DRAM chip is an integrated circuit (IC) made of millions of transistors and capacitors. Typically, a transistor and a capacitor are paired to create a DRAM cell, which represents a single bit of data. The capacitor holds the bit of information—a "0" or a "1". The transistor acts as a switch that lets the control circuitry on the memory chip read the capacitor or change its state. As known in the art, memory cells are etched onto a silicon wafer in an array of columns (bitlines) and rows (wordlines). The intersection of a bitline and wordline constitutes the address of the memory cell.

Briefly, after the formation of the wordlines, a dielectric layer is deposited on the wordlines and in inter-space between these wordlines. Contact holes are etched into the dielectric layer. Metals such as tungsten are deposited inside the contact holes, followed by chemical mechanical polishing (CMP).

FIG. 1 to FIG. 4 illustrate the formation of bitline contact devices in the fabrication of a DRAM chip according to the prior art method. As shown in FIG. 1, a semiconductor substrate 10 for making a DRAM device is provided having thereon a memory array area 11 and a peripheral area 21. A plurality of wordlines 12, 14, and 16 are defined on the main surface of the semiconductor substrate 10. Alignment mark (AM) 30, which is used to align a photo mask having a contact-hole pattern thereon with the wafer that is mounted on a stepper and scanner, is located in the peripheral area 21 of the semiconductor substrate 10. On the surface of the semiconductor substrate 10, a borophosposilicate glass (BPSG) layer 22 and a TEOS oxide layer 24 are deposited. A polysilicon layer 26 is deposited on the TEOS oxide layer 24. The polysilicon layer 26 acts as a hard mask in subsequent contact hole etching process.

As shown in FIG. 2, before performing the lithographic process and etching of the bitline contact holes (CB), an alignment window 29 that exposes a portion of the TEOS oxide layer 24 is formed in the polysilicon layer 26. The alignment window 29 is directly located above the alignment mark 30, such that the stepper and scanner may use the alignment mark 30 to align the photo mask with the wafer. To form the alignment window 29, a GV photo resist 28 is formed on the polysilicon layer 26 having an opening located directly above the alignment mark 30. The exposed polysilicon layer 26 is then etched away through the opening. The GC photo resist 28 is removed.

As shown in FIG. 3, after forming the alignment window 29, a CB photo resist 32 is formed on the polysilicon layer 26. Through the alignment window 29 and the alignment mark 30, a mask-wafer alignment is then carried to ensure precise image transfer. Thereafter, by means of exposure and development, a contact hole opening or CB opening 40 is created in the CB photo resist 32.

As shown in FIG. 4, using both the CB photo resist 32 and the polysilicon layer 26 as an etching hard mask, a dry etching process is carried out to etching the bitline contact hole (CB) into the polysilicon layer 26, the TEOS oxide layer 24, and the BPSG layer 22 through the CB opening 40, thereby forming a contact hole 50 between two wordlines 12 and 14. It is noteworthy that this dry etching process simultaneously etches away the TEOS oxide layer 34 and BPSG layer 22 through the alignment window to produce a recess 52 in the peripheral area 21. The subsequent zeroth level ($M_0$) metallization processes following the formation of contact hole 50 are known in the art. Metal such as tungsten, titanium, or titanium nitride is deposited on the substrate 10 and fills the contact hole 50 and recess 52. Conventional CMP is then carried out to remove metals outside the contact hole 50.

The above-described prior art process of forming bitline contact hole (CB) has at least two drawbacks. First, although the polysilicon layer 26 that acts as a part of the etching hard mask during the CB etching enables the reduction of the thickness of the CB photoresist and thus improving precision of image transfer, however, the nature of the high diffraction index of the polysilicon layer 26, which might interfere the mask-wafer alignment, is neutralizing this benefit. Secondly, as shown in FIG. 5, recess 52 formed in the peripheral area 21 during the etching of the CB contact hole 50 might lead to $M_0$ metal circuit open after the tungsten CMP process (dishing effect).

SUMMARY OF INVENTION

Accordingly, it is the primary object of the present invention to provide a semiconductor process to cope with the above-mentioned problems.

It is another object of the present invention to provide a method for precisely making a bitline contact hole (CB) on a substrate, which is capable of eliminating polysilicon hard mask interference during mask-wafer alignment.

According to the claimed invention, a semiconductor process capable of improving alignment accuracy is provided. A semiconductor substrate having thereon an array area and a peripheral area is prepared. The array area comprises a plurality of wordlines and the peripheral area comprises at least one alignment mark. At least one dielectric layer is deposited over the array area and the peripheral area. The dielectric layer covers the wordlines and the alignment mark. A thin silicon nitride layer is then deposited on the dielectric layer. A polysilicon layer is deposited on the thin silicon nitride layer. A first photo resist layer is coated on the polysilicon layer. An opening is then created in the first photo resist layer by conventional lithographic methods. The opening exposes a portion of the polysilicon layer and is located directly above the alignment mark. A portion of the polysilicon layer is etched away through the opening to form an alignment window in the polysilicon layer. The first photo resist layer is then stripped off. Subsequently, a second photo resist layer is coated on the polysilicon layer. The second photo resist layer fills the alignment window in the polysilicon layer. A contact hole opening is created in the second photo resist layer in said array area by conventional lithographic methods. Using the second photo resist layer, polysilicon layer, and the thin silicon nitride layer as an etching hard mask, a contact hole dry etching process is carried out to etch away the polysilicon layer, thin silicon nitride layer, and the dielectric layer through the contact hole opening in the second photo resist layer, thereby forming a contact hole in the array area.

It is advantageous that the dielectric layer directly above the alignment mark in the peripheral area is protected by the thin silicon nitride layer during the contact hole dry etching process.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Please refer to FIG. 6 to FIG. 9. FIG. 6 to FIG. 9 are schematic cross-sectional diagrams illustrating the formation of a contact plug device during the fabrication of a DRAM chip according to the preferred embodiment of the present invention, wherein like numerals designate the same or similar regions, layers or elements.

Figure 1:
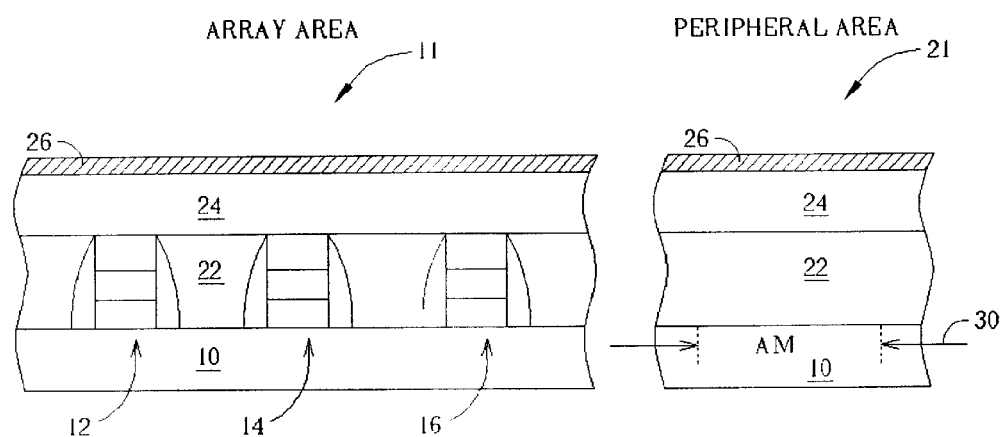
FIG. 1 to FIG. 4 are schematic cross-sectional diagrams illustrating the formation of bitline contact hole (CB) in the fabrication of a DRAM chip according to the prior art method.
Figure 2:
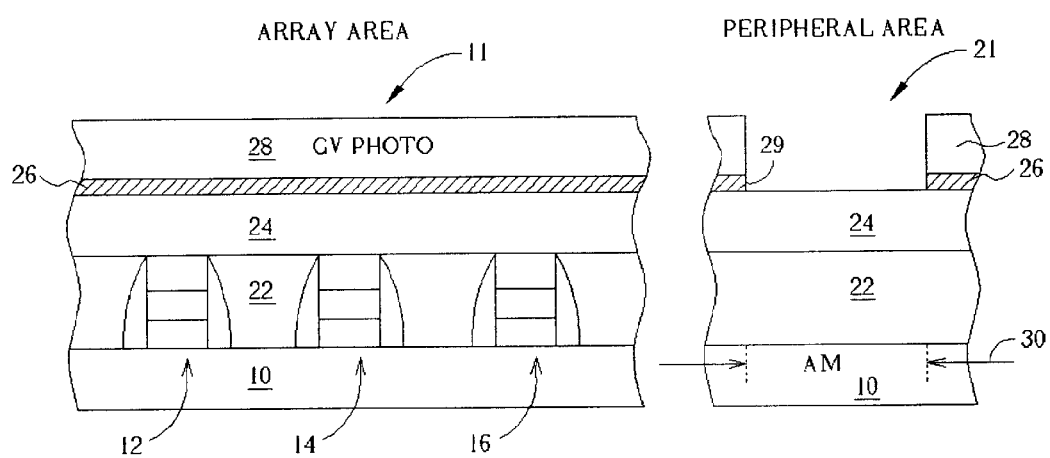
Figure 3:
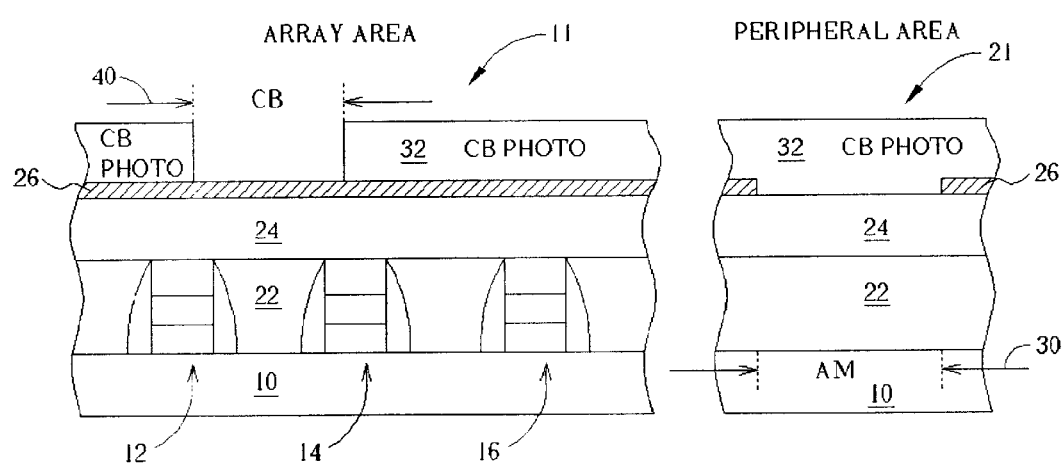
Figure 4:
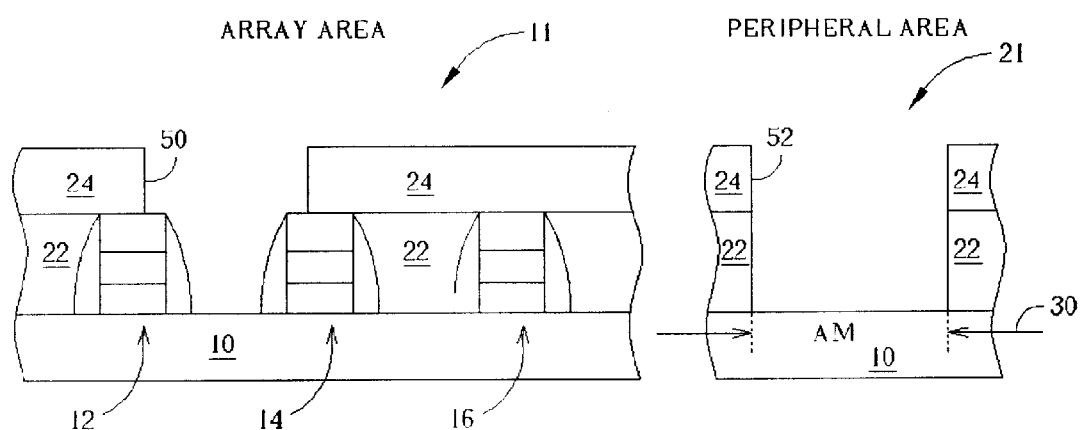
Figure 5:
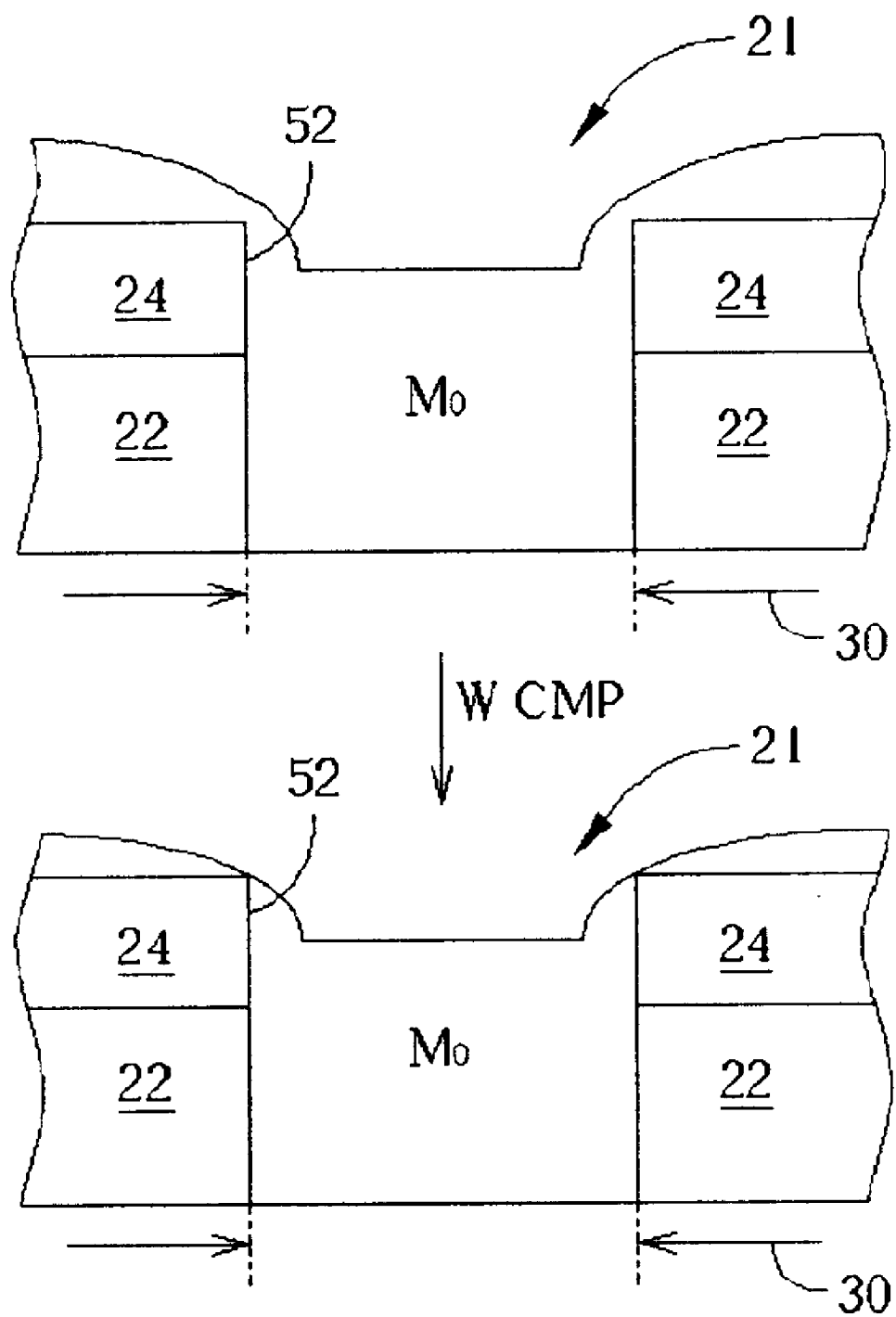
FIG. 5 schematically demonstrates the $M_0$ metal open problem that occurs in the peripheral area directly above the alignment mark (AM) after tungsten CMP according to the prior art.
Figure 6:
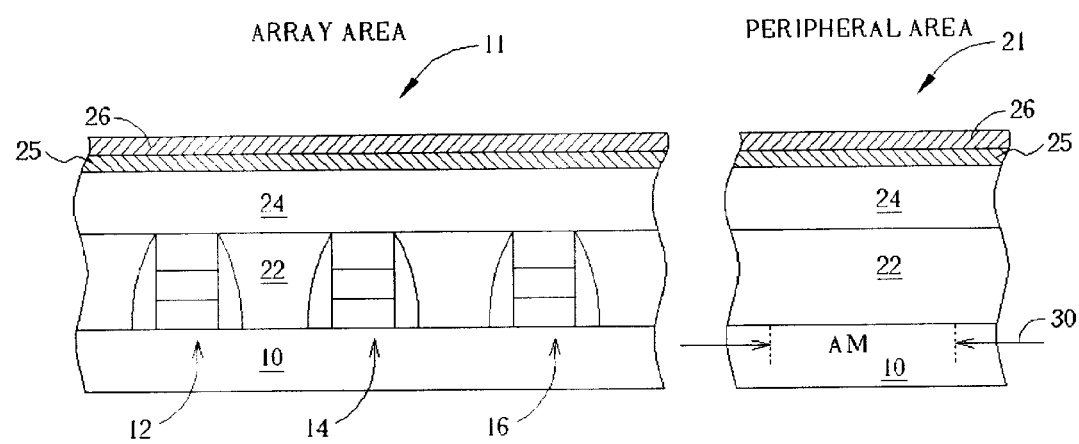
FIG. 6 to FIG. 9 are schematic cross-sectional diagrams illustrating the formation of a contact plug device during the fabrication of a DRAM chip according to the present invention.

As shown in FIG. 6, a semiconductor substrate 10 is prepared for making a DRAM chip. The semiconductor substrate 10 has at least one array area 11 and one peripheral area 21. A number of wordlines 12, 14, and 16 have been fabricated in the array area 11 on the semiconductor substrate 10. An alignment mark (AM) 30 is defined in the peripheral area 21 of the semiconductor substrate 10. As mentioned, the alignment mark 30 is used to align a photo mask for defining a contact-hole pattern with the semiconductor substrate 10 that is mounted on a wafer stage of lithographic apparatus such as a stepper and scanner. The alignment mark 30 may be specific structure and pattern formed into the semiconductor substrate 10 within the peripheral area 21. On the surface of the semi-conductor substrate 10, a borophosposilicate glass (BPSG) layer 22 and a TEOS oxide layer 24 are deposited.

A thin silicon nitride layer 25 is then deposited on the TEOS oxide layer 24. A polysilicon layer 26 is deposited on the silicon nitride layer 25. The thin silicon nitride layer 25 and the polysilicon layer 26 constitute a combined hard mask in subsequent contact hole etching process. It is noteworthy that the combined hard mask composed of the thin silicon nitride layer 25 and the polysilicon layer 26 has a lower effective diffraction index than a single polysilicon layer as the prior art. According to the preferred embodiment, the thin silicon nitride layer 25 has a thickness of about 100 angstroms to 300 angstroms.

Figure 7:
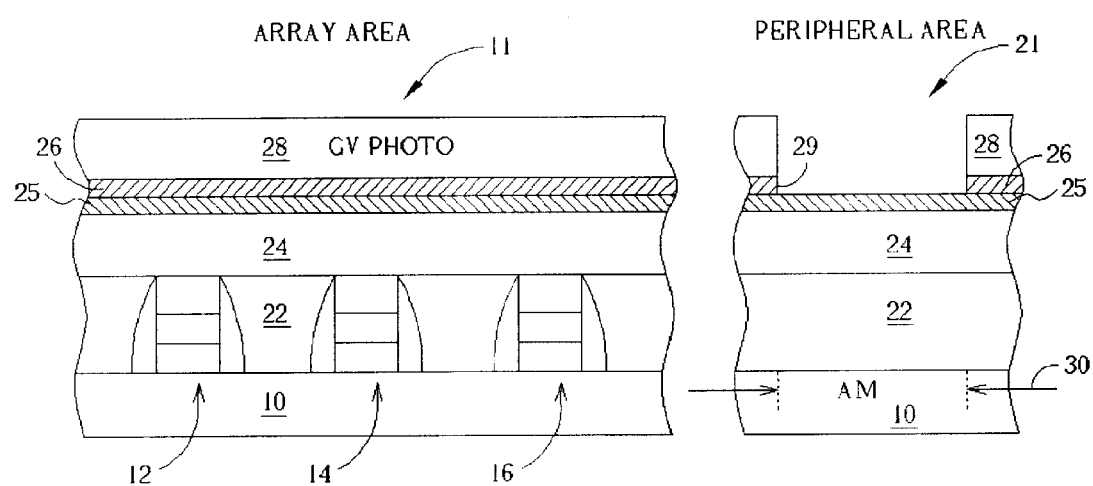

As shown in FIG. 7, before performing the lithographic process and etching of the bitline contact holes (CB), likewise, an alignment window 29, which exposes a portion of the thin silicon nitride layer 25 and is located directly above the alignment mark 30, is formed in the polysilicon layer 26. The alignment window 29 is directly located above the alignment mark 30 such that the stepper and scanner may use the alignment mark 30 to align the photo mask with the wafer. To form the alignment window 29, a GV photo resist 28 is formed on the polysilicon layer 26 having an opening located directly above the alignment mark 30. The exposed polysilicon layer 26 is then etched away through the opening. The GC photo resist 28 is removed. The presence of the thin silicon nitride layer 25 laid underneath the polysilicon layer 26 can reduce the interference effect of the polysilicon layer 26 during the mask-wafer alignment.

Figure 8:
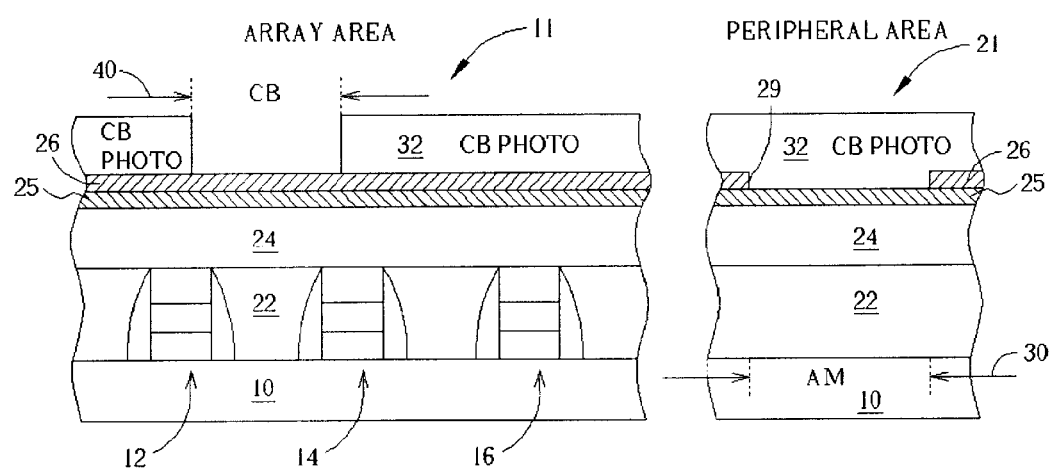

As shown in FIG. 8, after forming the alignment window 29, a CB photo resist 32 is coated on the polysilicon layer 26. Through the alignment window 29 and the alignment mark 30, a mask-wafer alignment is then carried to ensure precise and accurate image transfer. Thereafter, by means of exposure and development, a contact hole opening or CB opening 40 is created in the CB photo resist 32.

Figure 9:
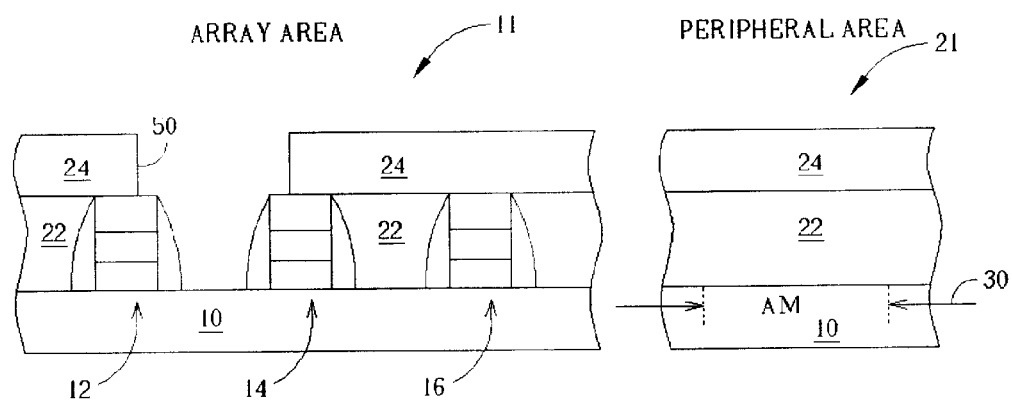

As shown in FIG. 9, using the CB photo resist 32, the polysilicon layer 26 and the thin silicon nitride layer 25 as an etching hard mask, a dry etching process is carried out to etching the bitline contact hole (CB) into the polysilicon layer 26, the thin silicon nitride layer 25, the TEOS oxide layer 24, and the BPSG layer 22 through the CB opening 40, thereby forming a contact hole 50 between two wordlines 12 and 14. Since the thin silicon nitride layer 25 stops the dry etching through the alignment window 29, there will be no recess defect formed in the peripheral area 21 above the alignment mark 30. The subsequent zeroth level ($M_0$) metallization processes following the formation of contact hole 50 are then carried out. Metal such as tungsten, titanium, or titanium nitride is deposited on the substrate 10 and fills the contact hole 50 and recess 52. Conventional CMP is then carried out to remove metals outside the contact hole 50.

Those skilled in the art will readily observe that numerous modification and alterations of the present invention method may be made while retaining the teachings of the invention. Accordingly, the above disclosure should be construed as limited only by the metes and bounds of the appended claims.

What is claimed is:

1. A semiconductor process capable of improving alignment accuracy, comprising:

providing a semiconductor substrate having thereon an array area and a peripheral area, wherein said array area comprises a plurality of wordlines and said peripheral area comprises at least one alignment mark;

depositing at least one dielectric layer over said array area and said peripheral area of said semiconductor substrate, wherein said dielectric layer covers said plural wordlines and said alignment mark;

depositing a thin silicon nitride layer on said dielectric layer;

depositing a polysilicon layer on said thin silicon nitride layer;

coating a first photo resist layer on said polysilicon layer;

forming an opening in said first photo resist layer, wherein said opening exposes a portion of said polysilicon layer and is located directly above said alignment mark;

etching away a portion of said polysilicon layer through said opening to form an alignment window in said polysilicon layer;

stripping said first photo resist layer;

coating a second photo resist layer on said polysilicon layer, wherein said second photo resist layer fills said alignment window in said polysilicon layer;

creating contact hole opening in said second photo resist layer in said array area;

using said second photo resist layer, said polysilicon layer, and said thin silicon nitride layer as an etching hard mask, performing a contact hole dry etching process to etch away said polysilicon layer, said thin silicon nitride layer, and said dielectric layer through said contact hole opening in said second photo resist layer, thereby forming a contact hole.

2. The semiconductor process according to claim 1 wherein said thin silicon nitride layer has a thickness of about 100 to 300 angstroms.

3. The semiconductor process according to claim 1 wherein said alignment mark is formed in said semiconductor substrate within said peripheral area.

4. The semiconductor process according to claim 1 wherein said dielectric layer comprises borophosposilicate glass (BPSG).

5. The semiconductor process according to claim 1 wherein said dielectric layer comprises TEOS oxide layer.

6. The semiconductor process according to claim 1 wherein said dielectric layer located directly above said alignment mark in said peripheral area is protected by said thin silicon nitride layer during said contact hole dry etching process.

* * * * *